United States Patent [19]
Arai

[11] 3,979,764
[45] Sept. 7, 1976

[54] CONTROLLED FADING SWITCHING CIRCUIT

[75] Inventor: Michio Arai, Tokyo, Japan

[73] Assignee: Sony Corporation, Tokyo, Japan

[22] Filed: July 23, 1974

[21] Appl. No.: 491,117

[30] Foreign Application Priority Data
July 24, 1973 Japan............................ 48-83372

[52] U.S. Cl................................. 357/22; 357/23; 357/38; 357/39; 357/40; 307/304
[51] Int. Cl.² ................. H01L 29/80; H01L 29/74; H01L 29/747; H01L 27/02
[58] Field of Search .................. 357/22, 23, 40, 45, 357/38, 39; 307/300, 304, 303

[56] References Cited
UNITED STATES PATENTS

| | | | |
|---|---|---|---|
| 3,335,342 | 8/1967 | Leistiko et al. ................... | 357/22 |
| 3,553,541 | 1/1971 | King..................................... | 357/22 |
| 3,663,873 | 5/1972 | Yagi...................................... | 357/22 |
| 3,761,785 | 9/1973 | Pruniaux............................. | 357/22 |
| 3,808,515 | 4/1974 | Davis et al.......................... | 357/22 |

Primary Examiner—Andrew J. James
Attorney, Agent, or Firm—Hill, Gross, Simpson, Van Santen, Steadman, Chiara & Simpson

[57] ABSTRACT

A switching circuit using a field effect transistor having a semiconductive substrate with a current path portion, first and second semiconductive regions forming a PN junction therebetween, the first region being capacitively coupled to the current path portion, and a control electrode connected to the second region. The switching circuit is operated with a signal applied to the control electrode.

8 Claims, 12 Drawing Figures

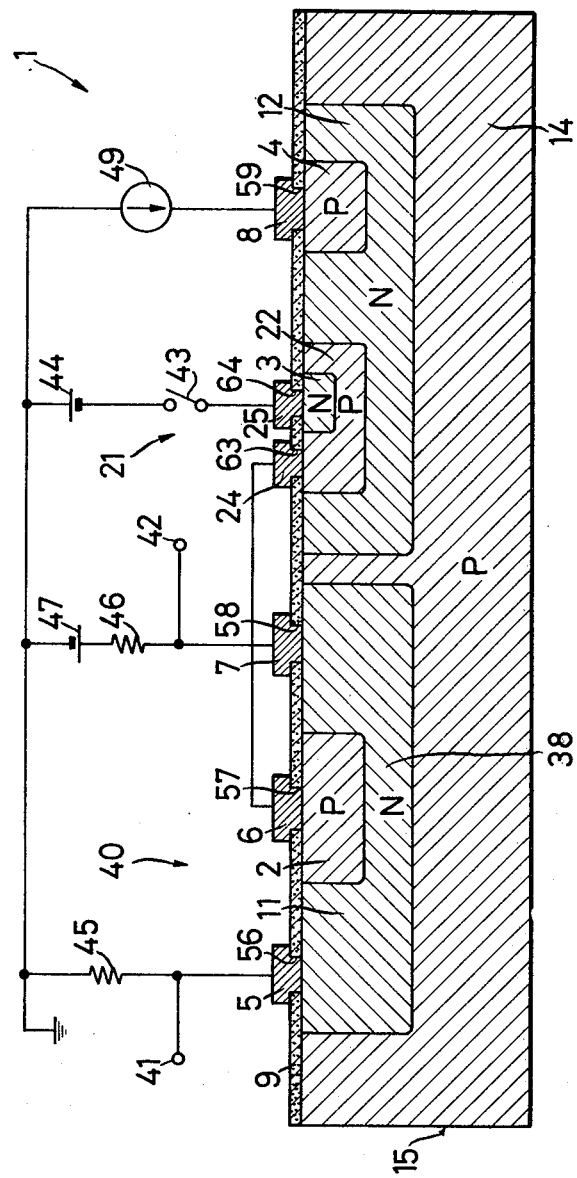

1

CONTROLLED FADING SWITCHING CIRCUIT

BACKGROUND OF THE INVENTION

1. Field of the Invention

This invention relates to a swtcing circuit, and more particularly to a switching circuit using a semiconductor device for fade-in and/or fade-out operations.

2. Description of the Prior Art

Generally, a fade-in or fade-out operation is utilized as a special effect in a radio or a television. The fade-in or fade-out operation can be performed in such a manner that a signal gain is manually and gradually varied or that a circuit is used by which the signal gain is automatically varied for a given time. However, the manual control is inconvenient for consumers. And in the automatic control, the arrangement of the circuit is complicated and a fade-in time or a fade-out time cannot be varied. Accordingly, also the automatic control is inconvenient and not practical.

SUMMARY OF THE INVENTION

An object of this invention is to provide a switching circuit which is simple in construction and whose fade-in time or fade-out time can be freely varied.

Another object of this invention is to provide a switching circuit in which no click occurs on the switching operation.

A further object of this invention is to provide a switching circuit using a novel semiconductor device.

In accordance with an aspect of this invention, a switching circuit comprises a semiconductor device including a semiconductive substrate having a current path portion, first and second semiconductive regions forming a PN junction therebetween, the first region being capacitively coupled to the current path portion, a control electrode connected to the second region, first and second terminals electrically connected to both ends of the current path portion respectively, and switch means for selectively applying a bias voltage to the control electrode.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIG. 6 is a schematic cross-sectional view of a semiconductor device according to a still another embodiment of this invention;

DESCRIPTION OF THE PREFERRED EMBODIMENTS

One embodiment of this invention will be described with reference to FIGS. 1 to 3.

Figure 1:
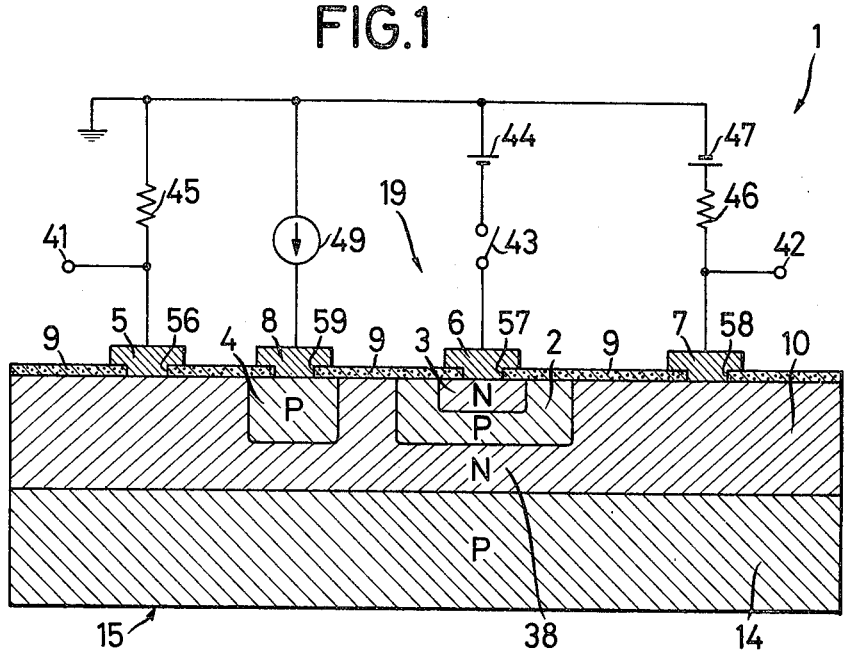
FIG. 1 is a schematic cross-sectional view of a semiconductor device according to one embodiment of this invention.

In FIG. 1, a semiconductor device 1 comprises a charge storage junction type field effect transistor 19 (hereafter called CSJ FET). An N-type semiconductive region 10 is deposited on a P-type semiconductive region 14 as a semiconductive substrate 15 by the epitaxial growth method. A P-type semiconductive region 2 is formed as a gate region in the N-type semiconductive region 10 by the diffusion method.

The conventional lateral junction type field effect transistor is formed as above mentioned. In the semiconductor device 1, an N-type semiconductive region 3 is formed in the P-type semiconductive region 2 by the diffusion method. A PN junction is formed between the P-type semiconductive region 2 and the N-type semiconductive region 3. A P-type semiconductive region 4 is formed in the N-type semiconductive region 10 by the diffusion method. The P-type semiconductive region 4 functions as an emitter region for injecting carriers.

An insulating layer 9 made of $SiO_2$ is deposited on the N-type semiconductive region 10. Openings 56, 57 and 58 made in the insulating layer 9 are closed by a source electrode 5, a gate electrode 6 and a drain electrode 7, respectively. Moreover, an opening 59 made in the insulating layer 9 is closed by an emitter electrode 8.

The gate electrode 6 is connected to the ground through a switch 43 and a DC power source 44 whose positive terminal is connected to the ground. The source electrode 5 is connected to the ground through a resistor 45. The drain electrode 7 is connected to the ground through a resistor 46 and a DC power source 47 whose negative terminal is connected to the ground. The emitter electrode 8 is connected to a current source 49. An input terminal 41 is connected to a connecting point of the source electrode 5 and the resistor 45. An output terminal 42 is connected to the drain electrode 7 and the resistor 46.

Operations of the semiconductor device 1 will be described with reference to FIGS. 2A to 2E.

Figure 2A:
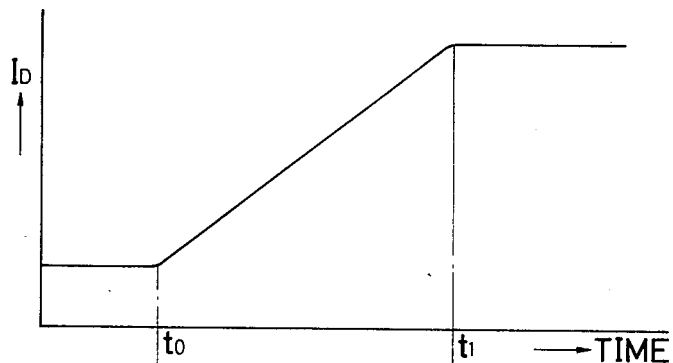
FIG. 2A is a graph showing the change of a drain current of the semiconductor device of FIG. 1.
Figure 2B:
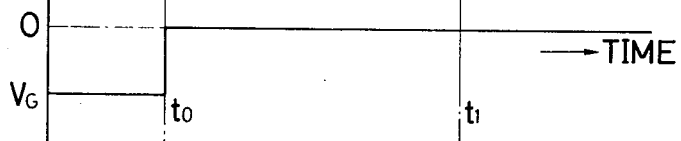
FIG. 2B is a graph showing a gate voltage applied to the semiconductor device of FIG. 1.

With the closing of the switch 43, a negative voltage $V_G$ is supplied to the gate electrode 6 from the DC power source 44. Therefore, the PN junction between the N-type semiconductive region 3 and the P-type semiconductive region 2 is forward-biased, while the PN junction between the P-type semiconductive region 2 and the N-type semiconductive region 10 is reverse-biased. Accordingly, the whole of the gate voltage $V_G$ is applied across the PN junction between the P-type semiconductive region 2 and the N-type semiconductive region 10, so that a depletion layer is spread adjacent to the PN junction between the P-type semiconductive region 2 and the N-type semiconductive region 10. With the spread of the depletion layer, a lateral channel 38 extending from the source electrode 5 to the drain electrode 7 is narrowed and so the resistance between the source electrode 5 and the drain electrode 7 is increased. The operation of the conventional junction field effect transistor (hereafter called J-FET) is substantially the same as the above-mentioned. The gate voltage $V_G$ remains supplied to the gate electrode 6 until time $t_o$, and hence the resistance $R_{SD}$ of the channel 38 remains increased (FIG. 2C) and the drain current $I_D$ remains decreased (FIG. 2A).

Figure 2C:
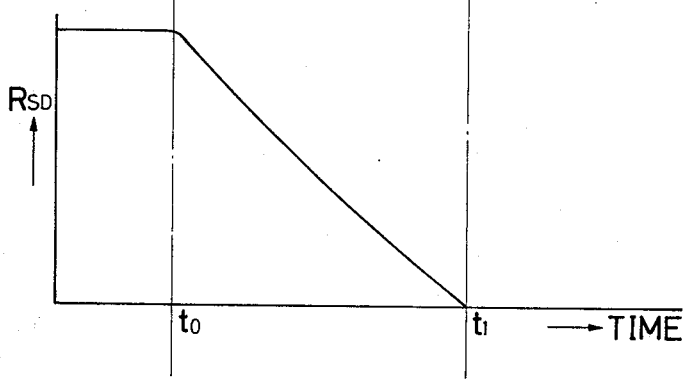
FIG. 2C is a graph showing the change of a source-drain resistance of the semiconductor device of FIG. 1.
Figure 2D:
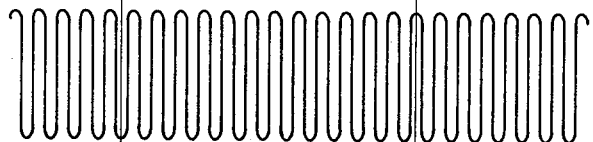
FIG. 2D is a waveform diagram depicting a signal applied to a source of the semiconductor device of FIG. 1.
Figure 2E:
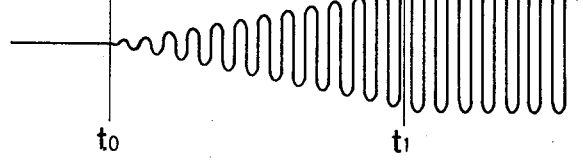
FIG. 2E is a waveform diagram depicting a signal obtained from a drain of the semiconductor device of FIG. 1.

When the switch 43 is opened at time $t_o$, the resistance $R_{SD}$ of the channel 38 is maintained increased due to the electric field of the negative charge stored in the P-type semiconductive region 2 and so the OFF-state is maintained, unless holes as minority carriers are injected from the P-type semiconductive region 4. However, in the semiconductor device 1 according to this invention, the holes are constantly injected to the N-type semiconductive region 10 from the P-type semiconductive region 4 by the current source 49 and so a constant flow of the holes reaches the depletion layer. Since the depletion layer is formed by the electric field of the negative charge stored in the P-type semiconductive region 2, the holes neutralize the negative charge and so the depletion layer is gradually narrowed. Accordingly, the resistance $R_{SD}$ of the channel 38 is substantially linearly decreased as shown in FIG. 2C. Correspondingly, with the resistance $R_{SD}$, the drain current $I_D$ is substantially linearly increased as shown in FIG. 2A. Time constants of the decrease of the resistance $R_{SD}$ and the increase of the drain current $I_D$ can be varied with the intensity of currents from the current source 49.

next, a fade-in operation of the semiconductor device 1 will be described with reference to the circuit representation shown on FIG. 3.

Figure 3:
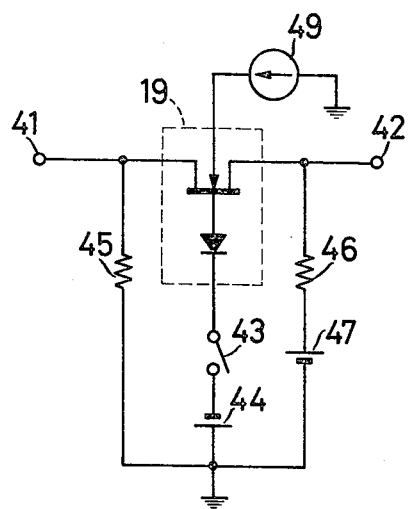
FIG. 3 is a circuit representation of the semiconductor device of FIG. 1.

Parts in FIG. 3 which correspond with the parts of FIG. 1 are denoted by the same reference numerals, which will not be described in detail.

As above mentioned, the source-drain resistance $R_{SD}$ of the CSJ FET 19 is kept higher during the closing of the switch 43. Namely, the OFF-state is maintained. Even when an analog signal such as an audio signal (FIG. 2D) is applied to the input terminal 41, no analog signal is generated at the output terminal 42, since the CSJ FET 19 is in the OFF-state during the time that switch 43 is closed.

After the switch 43 is opened at time $t_o$, the negative charge stored in the P-type semiconductive region 2 of the CSJ FET 19 is gradually neutralized with the constant injection of holes into the N-type semiconductive region 10 from the P-type semiconductive region 4. Since the source-drain resistance $R_{SD}$ is substantially linearly decreased (FIG. 2C), the analog signal is generated at the output terminal 42, as shown on FIG. 2E. The amplitude of the analog signal at the output terminal 42 is gradually and substantially linearly increased from time $t_o$. After the CSJ FET 19 is placed in a completely ON-state at the time $t_1$, the analog signal applied to the input terminal 41 appears at the output terminal 42 without fading.

Thus, the semiconductor device 1 functions as a switching circuit. Since the resistance between the input terminal 41 and the output terminal 42 is gradually decreased into the lower state, the semiconductor device 1 functions as a "fade-in" switch circuit.

In the one embodiment of the semiconductor device shown in FIGS. 1 to 3, the source-drain resistance $R_{SD}$ is substantially linearly decreased with the constant flow of the holes from the current source 49. If the carriers injected from the current source 49 are increased exponentially with time, the source-drain resistance $R_{SD}$ is decreased exponentially in correspondence with the increase of carriers. Generally, the source-drain resistance $R_{SD}$ can be decreased with the carriers in the form of any arbitrary function.

In the above embodiment, the negative charge stored in the P-type semiconductive region 2 is neutralized with the injection of the holes as the minority carriers from the P-type semiconductive region 4 as the emitter. It may be neutralized with the irradiation of light, instead of by injection of the carriers. The PN junction between the P-type semiconductive region 2 as the gate region and the N-type semiconductive region 10, is reverse-biased with the negative charge stored in the P-type semiconductive region 2. When light is irradiated onto the upper surface of the semiconductor device 1, carriers (electrons and holes) are generated in a transition region, namely the depletion layer to increase reverse currents, so that the negative charge stored in the P-type semiconductive region 2 is neutralized.

Another embodiment of this invention will be described with reference to FIGS. 4 and 5.

Figure 4:
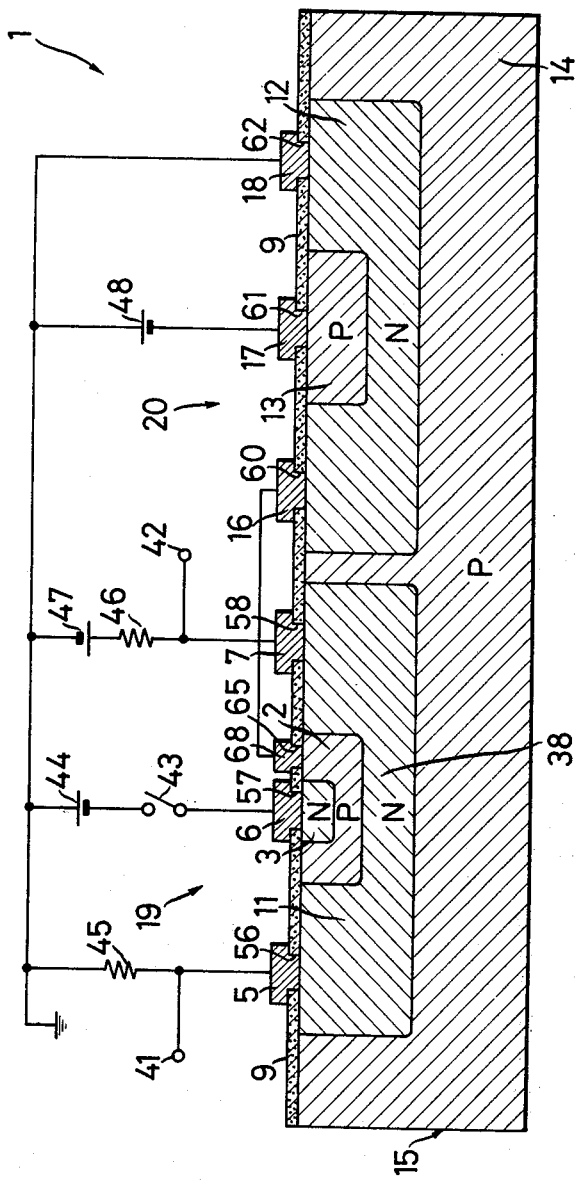
FIG. 4 is a schematic cross-sectional view of a semiconductor device according to another embodiment of this invention.
Figure 5:
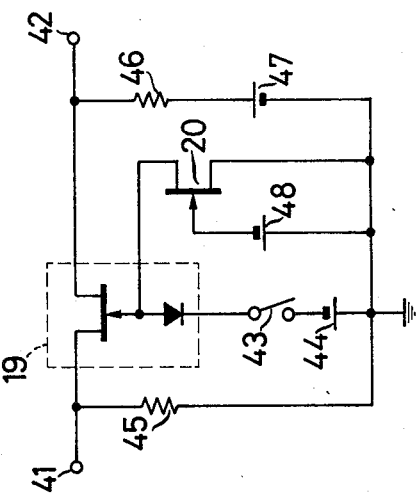
FIG. 5 is a circuit representation of the semiconductor device of FIG. 4.

Parts in FIG. 4 and FIG. 5 which correspond to the parts of the embodiment of FIG. 1, are denoted by the same reference numerals, which will not be described in detail.

In the semiconductor device 1 shown in FIG. 4, islandlike N-type semiconductive regions 11 and 12 are formed in the P-type semiconductive region 14 of the semiconductive substrate 15 by the diffusion method. Moreover, the P-type semiconductive region 2 and another P-type semiconductive region 13 are formed in the N-type semiconductive regions 11 and 12, respectively by the diffusion method. The N-type semiconductive region 3 is formed in the P-type semiconductive region 2 by the diffusion method. The insulating layer 9 made of $SiO_2$ is deposited on the upper surface of the P-type semiconductive region 14. The openings 56, 57 and 58 made in the insulating layer 9 are closed by the source electrode 5, the gate electrode 6 and the drain electrode 7, respectively. Openings 60, 61 and 62 made in the insulating layer 9 are closed by a drain electrode 16, a gate electrode 17 and a source electrode 18, respectively. An opening 65 made in the insulating layer 9 and facing to the P-type semiconductive region 2 is closed by an electrode 68 for discharging the stored charge. Thus, the CSJ FET 19 is formed in the N-type semiconductive region 11, while a J-FET 20 is formed in the N-type semiconductive region 12.

The gate electrode 6 of the CSJ FET 19 is connected to the ground through a switch 43 and a DC power source 44 whose positive terminal is connected to the ground. The source electrode 5 of the CSJ FET 19 is connected to the ground through the resistor 45. The drain electrode 7 of the CSJ FET 19 is connected to the ground through the resistor 46 and the DC power source 47 whose negative terminal is connected to the ground. The electrode 68 for discharging the stored charge, connected to the P-type semiconductive region 2 of the CSJ FET 19 is connected to the drain electrode 16 of the J-FET 20. The gate electrode 17 of the J-FET 20 is connected to the ground through the DC power source 48 whose positive terminal is connected to the ground. The source electrode 18 of the J-FET 20 is connected directly to the ground.

Operations of the semiconductor device 1 shown in FIG. 4 will be described with reference to FIG. 2A to FIG. 2E.

With the closing of the switch 43, the negative voltage $V_G$ is supplied to the gate electrode 6 from the DC power source 44. Therefore, the PN junction between the N-type semiconductive region 3 and the P-type semiconductive region 2 is forward-biased, while the PN junction between the P-type semiconductive region 2 and the N-type semiconductive region 11 is reverse-biased. Accordingly, the whole of the gate voltage $V_G$ is applied across the PN junction between the P-type semiconductive region 2 and the N-type semiconductive region 11, so that the depletion layer is spread adjacent to the PN junction between the P-type semiconductive region 2 and the N-type semiconductive region 11.

With the spread of the depletion layer, the lateral channel 38 extending from the source electrode 5 to the drain electrode 7 is narrowed and so the resistance between the source electrode 5 and the drain electrode 7 is increased. The operation of the conventional J-FET is substantially the same as the above mentioned. The gate voltage $V_G$ remains supplied to the gate electrode 6 till time $t_o$, where the resistance $R_{SD}$ of the channel 38 remains increased and so the drain current $I_D$ remains decreased (FIG. 2A).

When the switch 43 is opened at time $t_o$, the source-drain resistance $R_{SD}$ of the CSJ FET 19 is maintained increased due to the electric field of the negative charge stored in the P-type semiconductive region 2 and so the OFF-state is maintained, unless the negative charge stored in the P-type semiconductive region 2 of the CSJ FET 19 is discharged. In the semiconductor device 1 according to this invention, the charge stored in the P-type semiconductive region 2 is constantly discharged since a suitable voltage is supplied to the gate electrode 17 of the J-FET 20 from the DC power source 48. The charge is constantly discharged from the source electrode 18 through the source-drain current path of the J-FET 20. A time constant of the discharging of the charge can be varied with the voltage supplied to the gate electrode 17 from the DC power source 48.

With the discharging, the depletion layer is gradually narrowed, so that the source-drain resistance $R_{SD}$ of the CSJ FET 19 is substantially linearly decreased (FIG. 2C). Correspondingly with the source-drain resistance $R_{SD}$, the drain current $I_D$ is substantially linearly increased (FIG. 2A).

A fade-in operation of the semiconductor device 1 shown in FIG. 4 will be described with reference to the circuit representation shown on FIG. 5.

Parts in FIG. 5 which correspond with the parts of FIG. 4 are denoted by the same reference numerals, which will not be described in detail.

As above mentioned, the source-drain resistance $R_{SD}$ of the CSJ FET 19 is kept higher in the closing of the switch 43. Namely, the OFF-state is maintained. Even when an analog signal such as an audio signal (FIG. 2D) is supplied to the input terminal 41, no analog signal is generated at the output terminal 42, since the CSJ FET 19 is put in the OFF-state during the closing of the switch 43.

After the switch 43 is opened at time $t_o$, the negative charge stored in the P-type semiconductive region 2 of the CSJ FET 19 is constantly discharged through the drain-source current path of the junction FET 20. And since the source-drain resistance $R_{SD}$ of the CJS FET 19 is substantially linerly decreased (FIG. 2C), the analog signal is generated at the output terminal 42, as shown on FIG. 2E. The amplitude of the output signal at the output terminal 42 is gradually and substantially linearly increased from $t_o$. After the CSJ FET 19 is put completely into the ON- state at time $t_1$. the analog signal supplied to the input terminal 41 appears at the output terminal 42 without fading.

Thus, the semiconductor device 1 functions as a switching circuit. Since the resistance between the input terminal 41 and the output terminal 42 is gradually decreased into the lower state, the semiconductor device 1 functions as a "fade-in" switch circuit.

Still another embodiment of this invention will be described with reference to FIG. 6. Parts in FIG. 6 which correspond with the parts of the one embodiment, are denoted by the same numerals, which will not be described in detail.

In the semiconductor device 1 shown in FIG. 6, the island-like N-type semiconductive regions 11 and 12 are formed in the P-type semiconductive region 14 by the diffusion method. Moreover, the P-type semiconductive regions 2 and 4, and another P-type semiconductive region 22 are formed in the N-type semiconductive regions 11 and 12, respectively, by the diffusion method. The N-type semiconductive region 3 is formed in the P-type semiconductive region 22 by the diffusion method. The insulating layer 9 made of $SiO_2$ is deposited on the upper surface of the P-type semiconductive region 14. The openings 56, 57 and 58 made in the insulating layer 9 are closed by the source electrode 5, the gate electrode 6 and the drain electrode 7, respectively. Openings 63, 64 and 59 made in the insulating layer 9 are closed by an anode electrode 24, a cathode electrode 25 and an emitter electrode 8, respectively.

A J-FET 40 is formed in the N-type semiconductive region 11. A diode 21 and the P-type semiconductive region 4 are formed in the N-type semiconductive region 12. The P-type semiconductive region 4 functions as an emitter for injecting carriers which nautralize the charge stored in the P-type semiconductive region 22 of the diode 21. The gate electrode 6 of the J-FET 40 is connected to the anode electrode 24 of the diode 21. Accordingly, this semiconductor device 1 operates in the same manner as the aforementioned CSJ FET. Since the charge stored in the P-type semiconductive region 22 of the diode 21 is neutralized with the injection of the carriers from the P-type semiconductive region 4, this semiconductor device 1 operates in the same manner as the embodiment of FIG. 1.

In the semiconductor device 1 of FIG. 6, the cathode electrode 25 of the diode 21 is connected to the ground through the switch 43 and the DC power source 44 whose positive terminal is connected to the ground. The source electrode 5 of the J-FET 40 is connected to the ground through the resistor 45. The drain electrode 7 of the J-FET 40 is connected to the ground through the resistor 46 and the DC power source 47 whose negative terminal is connected to the ground. Moreover, the gate electrode 6 of the J-FET 40 is connected to the anode electrode 24 of the diode 21. The current source 49 is connected to the emitter electrode 8. The input terminal 41 is connected to the connecting point of the source electrode 5 and the resistor 45, while the output terminal 42 is connected to the connecting point of the drain electrode 7 and the resistor 46.

Operations of the semiconductor device 1 shown in FIG. 6 will be described with reference to FIGS. 2A to 2E.

With the closing of the switch 43, the negative voltage $V_G$ is supplied to the cathode electrode 25 from the DC power source 44. Therefore, the PN junction between the N-type semiconductive region 3 and the P-type semiconductive region 22 is forward-biased, while the PN junction between the P-type semiconductive region 2 and the N-type semiconductive region 11 is reverse-biased. Accordingly, the whole of the gate voltage $V_G$ is applied across the PN junction between the P-type semiconductive region 2 and the N-type semiconductive region 11, so that the depletion layer is spread adjacent to the PN junction between the P-type semiconductive region 2 and the N-type semiconductive region 11.

With the spread of the depletion layer, the lateral channel extending from the source electrode 5 to the drain electrode 7 is narrowed and so the resistance between the source electrode 5 and the drain electrode 7 is increased. The operation of the conventional J-FET is substantially the same as above-mentioned. The gate voltage $V_G$ remains supplied to the gate electrode 6 till time $t_o$, where the resistance $R_{SD}$ of the channel 38 remains increased and so the drain current $I_D$ remains decreased (FIG. 2A).

When the switch 43 is opened at time $t_o$, the source-drain resistance $R_{SD}$ is maintained increased due to the electric field of the negative charge stored in the P-type semiconductive regions 2 and 22 and so the OFF-state is maintained, unless the holes as the minority carriers are injected from the P-type semiconductive region 4. In the semiconductor device 1 according to this invention, the holes are constantly injected from the P-type semiconductive region 4 to the P-type semiconductive region 22 through the N-type semiconductive region 12, to neutralize the charge stored in the P-type semiconductive regions 22 and 2.

With the neutralization, the depletion layer is gradually narrowed, so that the source-drain resistance $R_{SD}$ is substantially linearly decreased (FIG. 2C). Correspondingly with the source-drain resistance $R_{SD}$, the drain current $I_D$ is substantially linearly increased (FIG. 2A). The time constants of the decrease of the channel resistance $R_{SD}$ and the increase of the drain current $I_D$ can be varied with the intensity of the current of the current source 49.

A fade-in operation of the semiconductor device 1 shown on FIG. 6 will be described with reference to the circuit representation shown in FIG. 3, since the circuit representation of the one embodiment of FIG. 1 is substantially the same as that of the embodiment of FIG. 6.

Parts in FIG. 3 which correspond with the parts of FIG. 6 are denoted by the same reference numerals, which will not be described in detail.

As above mentioned, the source-drain resistance of the J-FET 40 is kept high with the closing of the switch 43. Namely, the OFF-state is maintained. Even when an analog signal such as an audio signal (FIG. 2D) is supplied to the input terminal 41, no analog signal is generated at the output terminal 42, since the J-FET 40 is in the OFF-state during the closing of the switch 43.

After the switch 43 is opened at time $t_o$, the negative charge stored in the P-type semiconductive regions 2 and 22 is gradually neutralized with the constant injection of holes or carriers into the N-type semiconductive region 12 from the P-type semiconductive region 4. And since the source-drain resistance $R_{SD}$ is substantially linearly decreased (FIG. 2C), the analog signal is generated at the output terminal 42, as shown on FIG. 2E. The amplitude of the output signal at the output terminal 42 is gradually and substantially linearly increased from time $t_o$. After the J-FET 40 is put fully into the ON-state at time $t_1$, the analog signal supplied to the input terminal 41 appears at the output terminal 42 without fading.

Thus, the semiconductor device 1 functions as a switching circuit. Since the resistance between the input terminal 41 and the output terminal 42 is gradually decreased to a lower state, the semiconductor device 1 functions as a "fade-in" switch circuit.

In the embodiment of the semiconductor device shown in FIG. 6, the source-drain resistance $R_{SD}$ is substantially linearly decreased with the constant flow of holes from the current source 49. If the carriers time, from the current source 49 is increased exponentially with time, the source-drain resistance $R_{SD}$ is decreased exponentially in correspondence with the carriers. Generally, the source-drain resistance $R_{SD}$ can be decreased with the carriers in the form of any arbitrary function.

In the embodiment of FIG. 6, the negative charge stored in the P-type semiconductive region 2 is neutralized with the injection of the holes as the minority carriers from the P-type semiconductive region 4 as the emitter. It may be neutralized with the irradiation of light, instead of the injection of carriers. When light is irradiated onto the upper surface of the semiconductor device 1, carriers (electrons and holes) are generated in the transition region, namely the depletion layer to increase reverse currents, so that the negative charge stored in the P-type semiconductive region 2 is neutralized.

Moreover, the stored charge may be controlled by the discharging path of the J-FET, as the embodiment of FIG. 4, instead of the injection of the carriers from the emitter.

A still further embodiment of this invention will be described with reference to FIG. 7.

This embodiment is substantially the same as the embodiment of FIG. 6, except that the J-FET 40 is converted to a MOS FET 31, and that the conductivity type of the diode 21, the polarity of the DC power source 44, the conductivity type of the P-type semiconductive region 4 and the polarity of the current source 49 are reversed.

Figure 7:
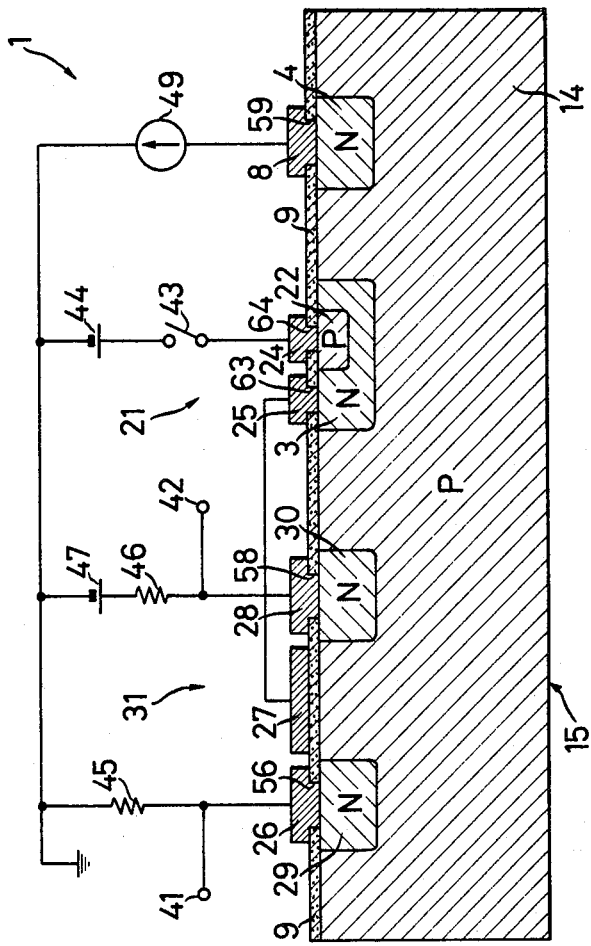
FIG. 7 is a schematic cross-sectional view of a semiconductor device according to a further embodiment of this invention.

Parts in FIG. 7 which correspond with the parts of FIG. 6 are denoted by the same reference numerals, which will not be described in detail.

In the semiconductor device 1 of FIG. 7, N-type semiconductive regions 3, 4, 29 and 30 are formed in the P-type semiconductive region 14, by the diffusion method. The N-type semiconductive regions 29 and 30 function as the source region and the drain region of the MOS FET 31, respectively. A gate electrode 27 is formed on the insulating layer 9 between the N-type semiconductive regions 29 and 30.

The quantity and the decay of the storage charge of the enhancement type MOS FET 31 can be controlled by the gate voltage $V_G$ supplied to the anode electrode 24 in the same manner as the semiconductor device 1 of FIG. 6. Moreover, the storage charge may be controlled by the irradiation of light. And a fade-in operation of this embodiment is substantially the same as that of the embodiment of FIG. 6.

A still further embodiment of this invention will be described with reference to FIG. 8.

This embodiment is equivalent to the embodiment of FIG. 7 in the fact that the MOS FET 31 and the diode 21 are formed in the P-type semiconductive region 14. The gate electrode 27 of the MOS FET 31 is connected to the cathode electrode 25 of the diode 21 to form a charge storage MOS FET. Moreover, a MOS FET 32 is formed in the P-type semiconductive region 14 for discharging the charge stored in the charge storage MOS FET.

Figure 8:
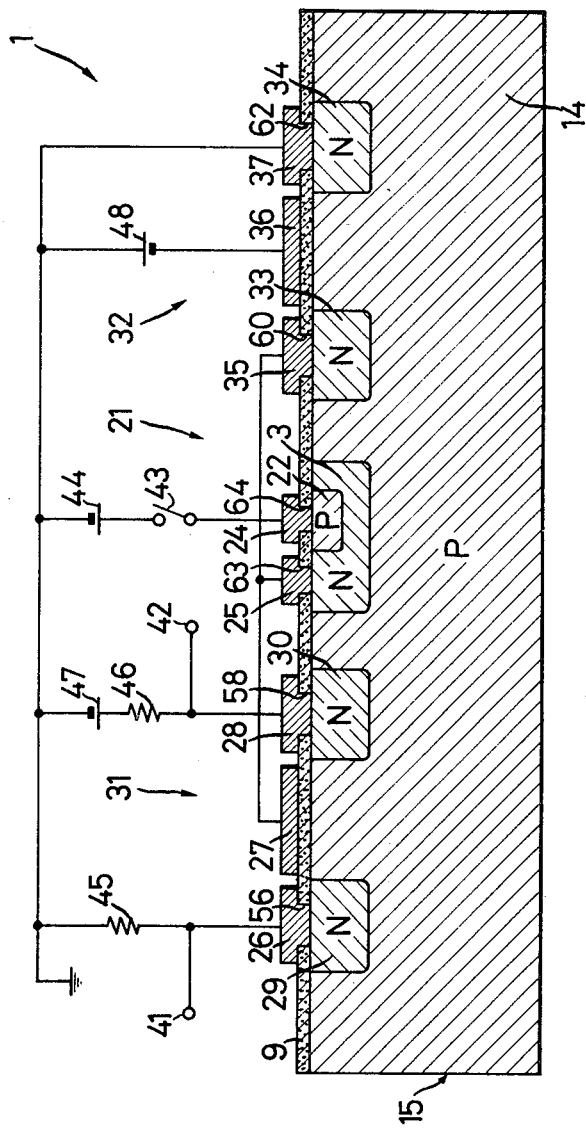
FIG. 8 is a schematic cross-sectional view of a semiconductor device according to a still further embodiment of this invention.

Parts in FIG. 8 which correspond with the parts of FIG. 7 are denoted by the same reference numerals, which will not be described in detail.

The N-type semiconductive region 30 as the drain region and the N-type semiconductive region 29 as the source region are formed in the P-type semiconductive region 14. The gate electrode 27 is formed on the insulating layer 9. Openings 56 and 58 made in the insulating layer 9 are closed by the source electrode 26 and the drain electrode 28. Thus, the MOS FET 31 is formed in the P-type semiconductive substrate 15.

The N-type semiconductive region 3 is formed in the P-type semiconductive region 14. The P-type semiconductive region 22 is formed in the N-type semiconductive region 3. Openings 63 and 64 made in the insulating layer 9 are closed by electrodes 24 and 25, respectively. Thus, the diode 2 is formed in the semiconductive substrate 15.

The gate electrode 27 of the MOS FET 31 is connected to the cathode electrode 25 of the diode 21. Thus, the charge storage MOS FET consisting of the MOS FET 31 and the diode 21 is formed in the semiconductive substrate 15.

An N-type semiconductive region 33 as a drain region and another N-type semiconductive region 34 as a source region are formed in the P-type semiconductive region 14. A gate electrode 36 is formed on the insulating layer 9. Openings 60 and 62 made in the insulating layer 9 are closed by a drain electrode 35 and a source electrode 37, respectively. Thus, the MOS FET 32 is formed in the semiconductive substrate 15. Moreover, the drain electrode 35 of the MOS FET 32 is connected to the cathode electrode 25 of the diode 21.

The embodiment of FIG. 8 is substantially the same as that of FIG. 4, except that the CSJ FET 19 and the J-FET 20 are converted to the charge storage MOS FET consisting of the MOS FET 31 and the diode 21 and the MOS FET 32, respectively. Accordingly, a fade-in operation of the embodiment of FIG. 8 is substantially the same as that of the embodiment of FIG. 4.

The MOS Fet 32 may be converted to the J-FET 20 as shown on FIG. 4, as the discharging path for the storage charge of the semiconductor device 1 of FIG. 8. On the contrary, the J-FET 20 may be converted to the MOS FET 32 as shown on FIG. 8, as the discharging path for the storage charge of the semiconductor device 1 of FIG. 4. By such conversions, the operation of the semiconductor device is not substantially varied.

In the above embodiments, the semiconductor device of this invention is intended for a fade-in circuit. However, the semiconductor device of this invention may be used for a fade-out circuit in such a manner that the connections of the drain electrode, the gate electrode and the source electrode, of the CSJ FET or the charge storage MOS FET are varied with respect to the external circuit. For example, the input terminal 41 and the output terminal 42 are connected in common to the source electrode 5 of the CSJ FET 19 and the connecting point of the drain electrode 7 and the resistor 46 is connected directly to the ground, in the semiconductor device 1 of FIG. 1.

Although illustrative preferred embodiments of the invention have been described in detail herein with reference to the accompanying drawings, it is to be understood that the invention is not limited to those precise embodiments, and that various changes and modifications may be effected therein without departing from the scope or spirit of the invention as defined in the appended claims. For example, instead of the AC signal, a DC signal may be supplied to the input terminal 41.

I claim as my invention:

1. A semiconductor switch comprising a semiconductor channel region of first impurity type having a planar surface and having source and drain regions therein, a gate region of second impurity type extending partially into said channel region from said planar surface between said source and drain regions to form a junction with a portion of said channel region, an auxiliary region of the first impurity type extending partially into said gate region and forming a junction therewith, a gate bias source, a switch connecting said gate bias source to said auxiliary region to forwardly bias the junction between said auxiliary region and said gate region and reversely bias the junction between said gate region and said channel region, whereby when said switch is closed a depletion region is formed at least partially across said channel region which increases the source to drain resistance, an emitter region of the second impurity type extending partially into said channel region from said planar surface, a current source connected to said emitter region which is poled to cause minority carriers to be injected into said depletion region for neutralizing stored charges therein to decrease the source to drain resistance for effecting a fade time, and a channel region biasing circuit connected between said source and drain regions having an input terminal at said source and an output terminal at said drain.

2. A semiconductor switch according to claim 1, wherein said first impurity type is N-type and said second inpurity type is P-type.

3. A semiconductor switch according to claim 2, in which said source, drain, auxiliary and emitter regions are each provided with an electrode, said source electrode being connected to an input terminal and to ground through a first resistor, said drain electrode being connected to an output terminal and through a second resistor and battery to ground, and said auxiliary electrode being connected through a switch and battery to ground, the negative side of said first battery and the positive side of said second battery being on the ground side.

4. A switching circuit adapted for providing an adjustable fading time during a switching operation comprising:

a. a charge storage junction field effect transistor having
   i. a semiconductor channel region of first conductivity type, ii. a first semiconductor region of second conductivity type diffused in a portion of said channel region to form a charge storage first PN junction;

iii. a second semiconductor region of first conductivity type diffused in said first region to form a second PN junction, iv. a gate electrode connected to said second region, v. a source electrode and a drain electrode connected to said channel region with said gate electrode therebetween, and vi. a carrier injection region of second conductivity type adjacent said first semiconductor region;

b. an input circuit connected to said source electrode;

c. a channel region biasing circuit connected between said source and drain electrodes and having an input terminal at said source electrode and an output terminal at said drain electrode;

d. a gate bias supply switchably connected between said gate electrode and channel biasing circuit for applying forward bias to said second PN junction and reverse bias to said charge storage first PN junction when said gate bias supply is connected; and e. an injection current source connected to said carrier injection region for controllably neutralizing stored charge in said first semiconductor region over a predetermined fading time when said gate bias supply is disconnected.

5. The switching circuit of claim 4 in which said channel region biasing circuit comprises a resistor connected to said source electrode and a power source in series with a resistor connected to said drain.

6. The switching circuit of claim 4 in which said gate bias supply comprises a series connection of a bias source and switch.

7. A switching circuit adapted for providing an adjustable fading time during a switching operation comprising:

a. a charge storage junction field effect transistor having source, drain, gate, and discharge electrodes connected thereto;

b. a junction field effect transistor having source, drain, and gate electrodes connected thereto, said source electrode being connected to said discharge electrode and said drain electrode being connected to a reference terminal;

c. a controllable bias source connected between a reference terminal and said junction field effect transistor gate for establishing the fading time;

d. input and output bias circuits connected between the reference terminal and the source and drain electrodes respectively of said charge storage junction field effect transistor; and e. a switchable bias circuit connected between said charge storage junction field effect transistor and the reference terminal;

whereby said junction field effect transistor controllably neutralizes stored charge in said charge storage junction field effect transistor to determine fading time when said switchable bias circuit is switched.

8. A switching circuit adapted for providing an adjustable fading time during a switching operation comprising:

a. a field effect transistor having source, gate, and drain electrodes connected thereto;

b. a charge storage diode having a first electrode connected to said field effect transistor gate, said diode also having a second electrode;

c. a carrier injection means connected between a reference and said charge storage diode to controllably inject carriers into said charge storage diode to determine fade time of the charge stored in said diode;

d. a switchable bias source between a reference and said charge storage diode second electrode; and e. input and output bias circuits connected between a reference terminal and the source and drain electrodes, respecitvely;

whereby the charge stored in said charge storage diode is controllably discharged to change the bias on the gate of said field effect transistor according to a fade time determined by said carrier injection means.

* * * * *